(12) United States Patent
Krummacher

(10) Patent No.: US 9,052,094 B2
(45) Date of Patent: Jun. 9, 2015

(54) SEMICONDUCTOR LIGHT SOURCE

(75) Inventor: Benjamin Claus Krummacher, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 58 days.

(21) Appl. No.: 13/390,289

(22) PCT Filed: Jun. 30, 2010

(86) PCT No.: PCT/EP2010/059290
§ 371 (c)(1),
(2), (4) Date: Aug. 6, 2012

(87) PCT Pub. No.: WO2011/018272
PCT Pub. Date: Feb. 17, 2011

(65) Prior Publication Data
US 2012/0298888 A1 Nov. 29, 2012

(30) Foreign Application Priority Data

Aug. 13, 2009 (DE) .......................... 10 2009 037 415

(51) Int. Cl.
| | | |
|---|---|---|
| *F21V 14/02* | (2006.01) | |
| *F21V 14/04* | (2006.01) | |
| *H01L 25/00* | (2006.01) | |
| *H01L 25/04* | (2014.01) | |
| *F21K 99/00* | (2010.01) | |
| *F21V 7/05* | (2006.01) | |
| *F21V 7/00* | (2006.01) | |
| *F21Y 105/00* | (2006.01) | |

(52) U.S. Cl.
CPC ................. *F21V 14/02* (2013.01); *H01L 25/00* (2013.01); *H01L 25/048* (2013.01); *F21V 7/0025* (2013.01); *F21V 7/0083* (2013.01); *F21V 14/04* (2013.01); *F21K 9/00* (2013.01); *F21V 7/05* (2013.01); *F21Y 2105/00* (2013.01)

(58) Field of Classification Search
CPC ..... F21V 7/0025; F21V 7/0083; H01L 33/58; H01L 33/60; H01L 25/00
See application file for complete search history.

(56) References Cited

U.S. PATENT DOCUMENTS

| 6,565,231 | B1 * | 5/2003 | Cok ............................... 362/653 |
| 7,317,182 | B2 * | 1/2008 | Schultz et al. ............ 250/227.31 |

(Continued)

FOREIGN PATENT DOCUMENTS

| CN | 201221699 | 4/2009 |
| DE | 203 00 806 | 5/2004 |

(Continued)

*Primary Examiner* — Nicole Ippolito
*Assistant Examiner* — James Choi
(74) *Attorney, Agent, or Firm* — Cozen O'Connor

(57) ABSTRACT

In at least one embodiment of the semiconductor light source (1), the latter comprises at least two planar elements (2). The planar elements (2) each contain a semiconductor material for producing ultraviolet or visible radiation (R) when the semiconductor light source (1) is in operation. The radiation (R) is in this case emitted at precisely one major face (3) of the planar elements (2). The reflectivity of the planar elements (2) for visible radiation, when the semiconductor light source (1) is not in operation, amounts to at least 80%. The planar elements (2) furthermore exhibit an average diameter (L) of at least 10 mm. Furthermore the major faces (3) of the planar elements (2) are arranged at an angle (α) to one another and facing one another. The angle (α) between the major faces (3) amounts in this case to between 30° and 120° inclusive.

12 Claims, 5 Drawing Sheets

(56) References Cited

U.S. PATENT DOCUMENTS

| | | |
|---|---|---|
| 2002/0176251 A1 | 11/2002 | Plank et al. |
| 2005/0088758 A1* | 4/2005 | Minano et al. ............... 359/726 |
| 2005/0162849 A1* | 7/2005 | Keuper ........................ 362/227 |
| 2005/0248935 A1* | 11/2005 | Strip et al. .................... 362/145 |
| 2006/0256557 A1* | 11/2006 | Kanamori et al. ............ 362/249 |
| 2008/0192458 A1* | 8/2008 | Li .................................. 362/84 |
| 2010/0118522 A1* | 5/2010 | Hente .......................... 362/190 |
| 2011/0122618 A1* | 5/2011 | Gantenbrink ................ 362/241 |
| 2011/0199789 A1* | 8/2011 | Huang et al. ................. 362/616 |
| 2011/0305015 A1* | 12/2011 | Hung et al. .................. 362/235 |
| 2013/0182431 A1* | 7/2013 | Wu ............................... 362/235 |
| 2015/0036350 A1* | 2/2015 | Palikaras et al. ............. 362/297 |

FOREIGN PATENT DOCUMENTS

| | | |
|---|---|---|
| DE | 10 2006 019 857 | 11/2006 |
| DE | 101 25 341 | 11/2006 |
| DE | 20 2008 010 884 | 12/2008 |
| EP | 1260196 A2 * | 11/2002 |
| EP | 1 569 283 | 8/2005 |
| WO | WO 2008/135898 | 11/2008 |

* cited by examiner

A)

B)

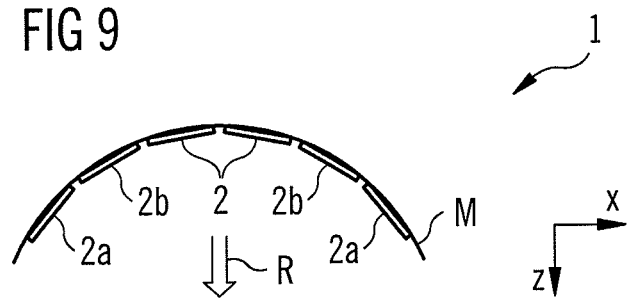
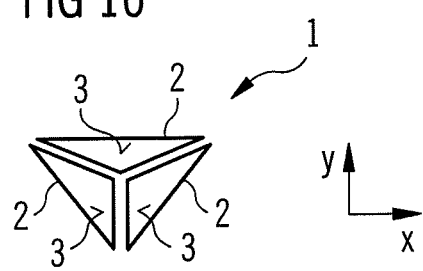
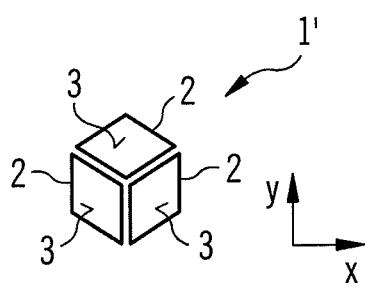
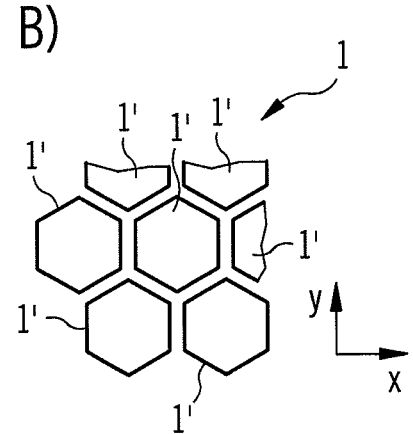

SEMICONDUCTOR LIGHT SOURCE

RELATED APPLICATIONS

This is a U.S. national stage of application No. PCT/EP2010/059290, filed on Jun. 30, 2010.

This application claims the priority of German application no. 10 2009 037 415.9 filed Aug. 13, 2009, the entire content of which is hereby incorporated by reference.

BACKGROUND OF THE INVENTION

The invention relates to a semiconductor light source.
Document DE 20 2008 010 884 U1 relates to a luminaire.

SUMMARY OF THE INVENTION

An object to be achieved is to provide a semiconductor light source which displays a predeterminable emission pattern.

According to at least one embodiment of the semiconductor light source, the latter comprises at least two planar elements. The planar elements are in this case in particular separate, individual, independently arrangeable and/or produced elements, which are preferably of flat or plane configuration. Planar element means in particular that the average diameter is greater than the average thickness of the planar element. In particular, the average diameter amounts to at least ten times, preferably at least a hundred times the average thickness.

According to at least one embodiment of the semiconductor light source, the planar elements each comprise an organic or inorganic semiconductor material for producing ultraviolet or visible radiation when the semiconductor light source is in operation. In other words, the planar elements are designed actively to generate visible or ultraviolet radiation when in operation. The planar elements are thus active, radiation-emitting elements when the semiconductor light source is in operation.

According to at least one embodiment of the semiconductor light source, the planar elements emit the radiation produced in operation in each case at precisely one major face, i.e. the planar elements may be elements emitting over an area of a major face, in particular over the entire area or substantially the entire area thereof.

According to at least one embodiment of the semiconductor light source, the reflectivity of the planar elements for visible radiation amounts at least when the light source is not in operation to at least 80%, in particular at least 85%, preferably at least 92%. The reflectivity should in this case be averaged over the entire major face of the planar element emitting radiation when the semiconductor light source is in operation. The reflectivity preferably exceeds the stated values in the entire visible spectral range of 450 nm to 780 nm inclusive, but at least averaged over the stated spectral range. The reflectivity is here a quotient of reflected radiant power and incident radiant power.

According to at least one embodiment of the semiconductor light source, the average diameter of the planar elements amounts in each case to at least 10 mm, preferably at least 30 mm. In the case for example of planar elements with a square outline, the average diameter corresponds to an edge length of the planar elements, when seen in plan view. If the planar elements are for example of rectangular configuration, the ratio of the edge lengths of the long sides and the short sides of the planar elements thus preferably amounts to at most five, with the average diameter resulting from an average value of the edge lengths.

According to at least one embodiment of the semiconductor light source, the major faces of the planar elements are arranged at an angle to one another and facing one another. The angle between the major faces here amounts preferably to between 30° and 120° inclusive, in particular between 45° and 75° inclusive, particularly preferably between 55° and 65° inclusive.

In at least one embodiment of the semiconductor light source, the latter comprises at least two planar elements. The planar elements each contain a semiconductor material for producing ultraviolet or visible radiation when the semiconductor light source is in operation. The radiation is in this case emitted at precisely one major face of the planar elements. The reflectivity of the planar elements for visible radiation amounts, when the semiconductor light source is not in operation, to at least 80%. Moreover, the planar elements have an average diameter of at least 10 mm. Furthermore, the major faces of the planar elements are arranged at an angle to one another and facing one another. The angle between the major faces amounts in this case to between 30° and 120° inclusive.

According to at least one embodiment of the semiconductor light source, part of the radiation emitted by the major face of a first one of the planar elements impinges on the major face of a second one of the planar elements which is facing the major face of the first planar element. At the major face of the second planar element, reflection preferably occurs precisely once, followed by outcoupling of the relevant part of the radiation out of the semiconductor light source. In other words, the second planar element forms a mirror for part of the radiation which is emitted by the first planar element and vice versa.

Because the planar elements in particular reciprocally reflect the emitted radiation at least in part, and as a result of the mutually angled arrangement, the emission pattern of the semiconductor light source is adjustable. For example, a solid angle range becomes smaller relative to at least one spatial direction in which the radiation is emitted, the smaller is the angle between the major faces of the planar elements relative to this spatial direction.

According to at least one embodiment of the semiconductor light source, the following relationship applies to an emission pattern of at least one of the planar elements or all the planar elements:

$$I(\beta)=I_{max}\cos(\beta).$$

$I_{max}$ is here a maximum radiant intensity, which is emitted by the planar element in a specific direction, in particular in a direction parallel to a normal of the major face of the planar element. $\beta$ is an angle to the normal of the major face and I is a radiant intensity of the planar element in the direction defined by the angle $\beta$. The stated relationship applies to the emission pattern, preferably with a tolerance of at most 0.2 $I_{max}$ or at most 0.1 $I_{max}$, in particular with a tolerance of at most 0.05 $I_{max}$, preferably of at most 0.02 $I_{max}$. In other words, $I(\beta)=I_{max}(\cos(\beta)\pm T)$, wherein T=0.2 or 0.1 or 0.05 or 0.02.

According to at least one embodiment of the semiconductor light source, the distance between two adjacent planar elements amounts, in a direction perpendicular to a bisector relative to the angle $\alpha$ between the mutually facing major faces of the planar elements, to between 0.15 and 0.35 times inclusive or between 1.75 and 2.25 times inclusive the average diameter of the planar elements. In other words, the planar elements are spaced from one another in a lateral direction. The distance is here either comparatively small or, in each case relative to the average diameter of the planar elements, comparatively large.

According to at least one embodiment of the semiconductor light source, the emission pattern comprises at least one intensity maximum in an angular range of between 25° and 70° inclusive, in particular between 50° and 65° inclusive. The angle is here related to the bisector between the mutually facing major faces of the planar elements. In other words, a maximum intensity, relative to an emission angle, is not emitted in a direction perpendicular to a main direction of extension of the semiconductor light source and/or the planar elements, but rather in a direction different therefrom.

According to at least one embodiment of the semiconductor light source, a radiation fraction of the radiation generated by the semiconductor light source when in operation, which fraction is emitted into a half space remote from the major faces, amounts to between 20% and 40% inclusive, in particular to between 30% and 40% inclusive. The half space is here formed in particular by a solid angle range of between 90° and 180° inclusive, relative for example to the bisector between the mutually facing major faces of the planar elements.

According to at least one embodiment of the semiconductor light source, the emission pattern thereof is not rotationally symmetrical. In particular, the emission pattern, when the semiconductor light source is viewed in plan view, comprises precisely one or precisely two axes of symmetry. For example, when the semiconductor light source is viewed in plan view, the radiation generated by the semiconductor light source fans out to different extents in two mutually perpendicular directions, i.e. half-value angles of the emission pattern along in particular the two axes of symmetry or along the one axis of symmetry and a direction perpendicular to this axis of symmetry, are different from one another.

In this case, the half-value angle is in particular in each case that angle at which a radiant intensity, relative to a maximum radiant intensity or to a maximum luminous flux in a specific direction, has dropped by a half.

According to at least one embodiment of the semiconductor light source, the planar elements each comprise organic light-emitting diodes. The major faces of the respective planar elements are preferably each at least 50%, in particular at least 80% or at least 90% covered by the organic light-emitting diodes. In other words, the entire or substantially the entire major face of the planar elements is preferably covered by the organic light-emitting diode.

According to at least one embodiment of the semiconductor light source, one of the planar elements or all of the planar elements are organic light-emitting diodes.

According to at least one embodiment of the semiconductor light source, one of the planar elements or all of the planar elements comprise at least four inorganic optoelectronic semiconductor chips, in particular at least six optoelectronic semiconductor chips, preferably at least ten optoelectronic semiconductor chips. The proportion of the major face of the respective planar element which is covered by the semiconductor chips amounts in each case in particular to at most 5%, preferably in each case to at most 3%. In other words, the major face of the planar element is substantially uncovered by the semiconductor chips.

According to at least one embodiment of the semiconductor light source, the planar elements reflect visible radiation at least partially such that an angle of incidence of the radiation is equal to an angle of emergence of the radiation. In other words, the planar elements do not reflect diffusely.

According to at least one embodiment of the semiconductor light source, the planar elements exhibit different areas, when the semiconductor light source is viewed in plan view. In other words, in a projection onto a plane, defined in particular by a main plane of extension and/or by a plane perpendicular to a main emission direction of the semiconductor light source, the planar elements exhibit unequal areas. The major faces of the planar elements may here exhibit identical areas when the respective major faces are viewed in plan view. In other words, the planar elements may exhibit different, mutually differing orientations relative to the main plane of extension and/or the main emission direction.

According to at least one embodiment of the semiconductor light source, the planar elements do not transmit visible radiation and ultraviolet radiation, i.e. the planar elements are neither transparent nor translucent.

BRIEF DESCRIPTION OF THE DRAWINGS

A semiconductor light source described herein is explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

In the drawings:

FIGS. 1, 4 and 6 to 11 show schematic representations of exemplary embodiments of semiconductor light sources described herein.

DETAILED DESCRIPTION OF THE DRAWINGS

Figure 1:
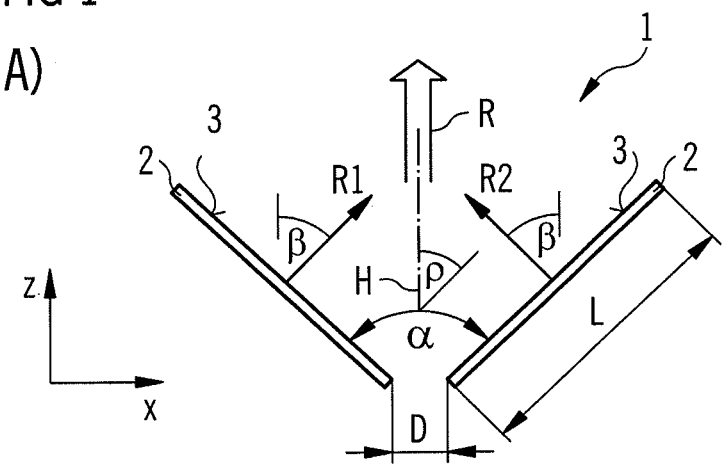
Figure 1:
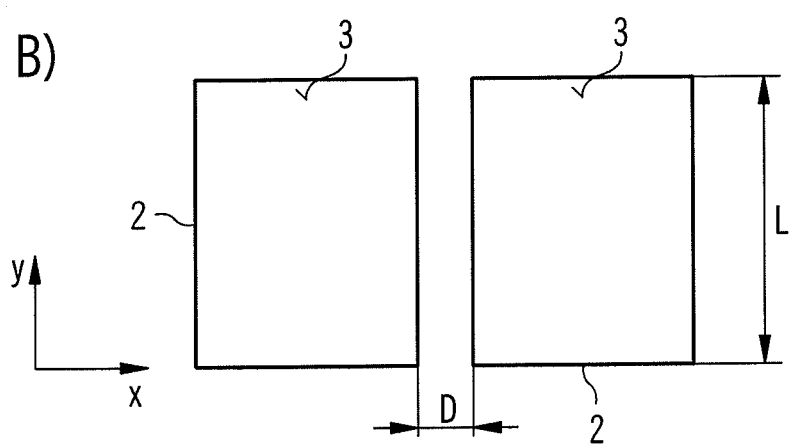

FIG. 1 shows an exemplary embodiment of a semiconductor light source 1. The semiconductor light source 1 includes two planar elements 2. Each of the planar elements 2 comprises a major face 3, via which electromagnetic radiation R is emitted in the visible and/or ultraviolet spectral range when the semiconductor light source 1 is in operation.

The major faces 3 of the planar elements 2 further exhibit a reflectivity for visible radiation, averaged over the entirety of the major faces 3, which preferably amounts to at least 95%. The planar elements 2 are opaque to visible radiation. The major faces 3 of the semiconductor light source 1 thus act as specular areas, at least when the semiconductor light source 1 is not in operation. For example, the planar elements 2 each comprise a support of glass, which is coated with a metal on one major face.

In addition, the planar elements 2 are preferably large-area emitters and/or Lambertian emitters. This may mean a direction-dependent radiant intensity $I(\beta)$ corresponds approximately to the relationship $I(\beta)=I_{max}\cos(\beta)$. The angle $\beta$ relates in each case to a normal to the major faces 3.

The two major faces 3 of the planar elements 2, at which the radiation is emitted when the semiconductor light source 1 is in operation, are in each case of plane configuration, arranged at an angle $\alpha$ relative to one another and spaced from one another in a lateral direction x by a distance D, cf. the side view in FIG. 1A and the plan view in FIG. 1B. The equal-sized planar elements 2 comprise an approximately square outline with an edge length L, the edge length L corresponding to the average diameter of the planar elements 2. In plan view, see FIG. 1B, the square-outline planar elements 2 look rectangular, however.

Because the major faces 3 of the planar elements 2 have a reflective action and are arranged at an angle to one another, part of the radiation R1, R2 emitted by the planar elements 2 impinges on the in each case other, opposing planar element 2. Reflection once at the in each case other planar element 2 and subsequent radiation outcoupling out of the semiconductor light source 1 result in shaping of the emission pattern of the radiation R emitted by the semiconductor light source 1. A maximum intensity is emitted in a direction z of a bisector H of the angle α between the major faces 3.

The angle α amounts to between 30° and 120° inclusive, preferably to between 55° and 65° inclusive. In contrast thereto, the angle α in the exemplary embodiments according to FIGS. 1 and 2 amounts to around 90°. The distance D between the planar elements 2 amounts to around 0.15 times the edge length L. As a result of the spacing of the planar elements 2, a part of the radiation R produced by the planar elements 2 when the semiconductor light source 1 is in operation may enter a half-space remote from the major faces 3. If the semiconductor light source 1 is used as a ceiling luminaire, for example, such that a major part of the radiation R is emitted away from the ceiling, a small fraction of radiation nonetheless reaches the ceiling. This makes the illumination produced by the semiconductor light source 1 more pleasant to an observer.

Figure 2:
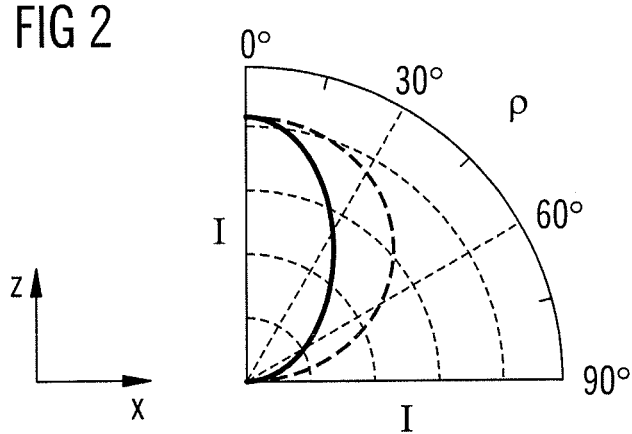
FIGS. 2, 3 and 5 show schematic representations of emission patterns of semiconductor light sources described herein.

The emission pattern of the semiconductor light source 1 is illustrated in FIG. 2, which plots the direction-dependent intensity I as a function of the angle ρ relative to the bisector H, see the solid line. In comparison to a Lambertian emission pattern of the planar elements 2, cf. the dashed line, the radiation is directed to a markedly greater degree in a forwards direction or in a z direction. In other words, an aperture angle or a half-value angle of the radiation emitted by the semiconductor light source 1 is reduced markedly compared with a Lambertian emitter.

Figure 3:
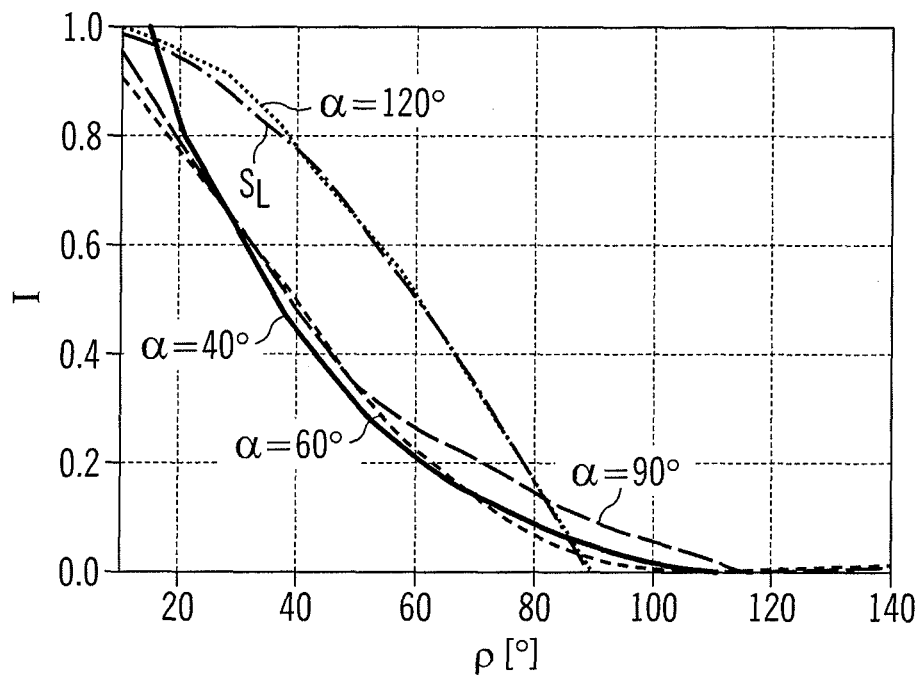

FIG. 3 shows the angle-dependent radiant intensity I as a function of the angle ρ for different semiconductor light sources 1 with different angles α between the major faces 3 of the planar elements 2. By way of comparison the emission pattern of a Lambertian emitter is also plotted, see the curve labelled $S_L$. Since the planar elements 2 exhibit a distance D other than zero from one another in the lateral direction, where D≤0.15×L, a small fraction of radiation is also emitted into the half space remote from the major faces 3. This half space exhibits an angular range, relative to the bisector H, of 90° to 180° inclusive.

For large aperture angles between the mutually facing major faces 3, for example α=120°, the emission pattern approaches that of a Lambertian emitter. For small aperture angles, for example α=40° or α=60°, the emission is concentrated onto small angles ρ. For an aperture angle of α=90°, already a significantly larger proportion of the radiation R is emitted into an angular range with 60°<ρ<80° than with a Lambertian emitter.

For the angles 60 =40°, α=60°, α=90° and α=120° the half-value angles θ50 then amount to 35°, 38°, 42° and 45° respectively. The half-value angles θ50 correspond to the angles within which 50% of the luminous flux is emitted.

Figure 4:
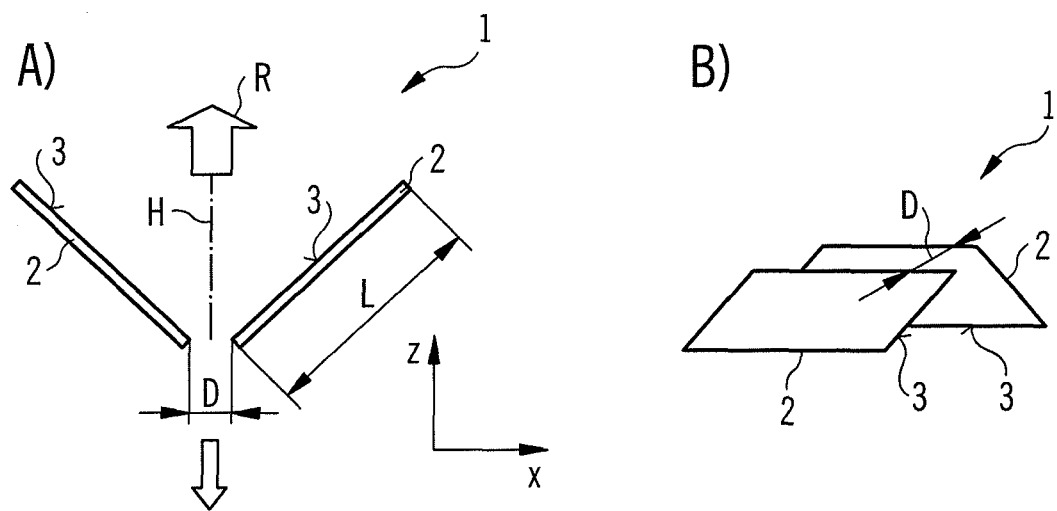

With the semiconductor light source 1 according to FIG. 4, see the side view according to FIG. 4A and the three-dimensional representation according to FIG. 4B, the distance D between the planar elements 2 is greater. In this way, a significant fraction R3 of radiation is emitted into the half-space remote from the major faces 3 relative to the radiation R emitted in the z direction. The intensity ratio of radiation R to radiation R3 is indicated by the width of the arrows symbolising the radiation R, R3.

Figure 5:
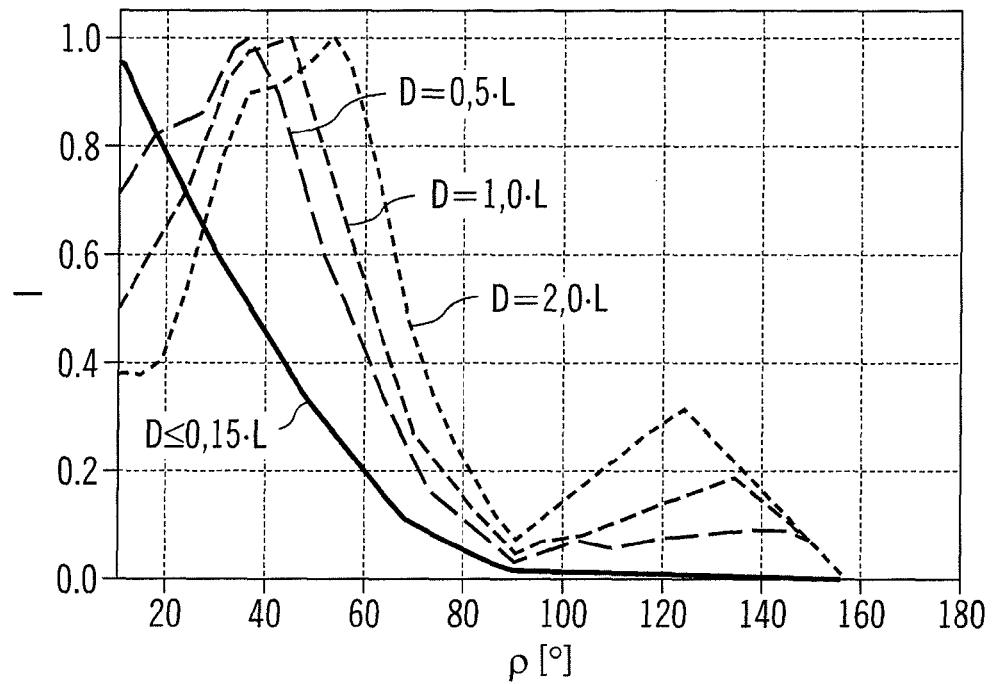

FIG. 5 shows the angle-dependent intensity I of the radiation R along the emission angle ρ for different semiconductor light sources 1 and for different spacings D between the planar elements 2. The angle α between the planar elements 2 here amounts in each case to around 60°. The figure shows the angle-dependent radiant intensities I for the instances in which D≤0.15×L, D=0.5×L, D=1.0×L and D=2.0×L. In the instance D≤0.15×L the curve corresponds approximately to that of FIG. 3 for α=60°. The latter curve is plotted by way of comparison for the instance in which the distance D between the planar elements 2 is comparatively small. The fraction of the radiation R3, measured using the radiation generated by the semiconductor light source 1 when in operation and the radiation R emitted in the z direction, which fraction is emitted into the half-space remote from the major faces 3, amounts to around 19% for D=0.5×L, around 27% for D=1.0×L and around 36% for D=2.0×L.

For larger relative distances D between the planar elements 2, i.e. in particular for D=1.0×L and D=2.0×L, the angle-dependent radiant intensity I exhibits a maximum in the case of angles ρ of between around 35° and 65° inclusive. With an increasing distance D, a larger fraction of radiation is also emitted into the half-space remote from the major faces 2 with angles 90°<ρ<180°.

Figure 6:
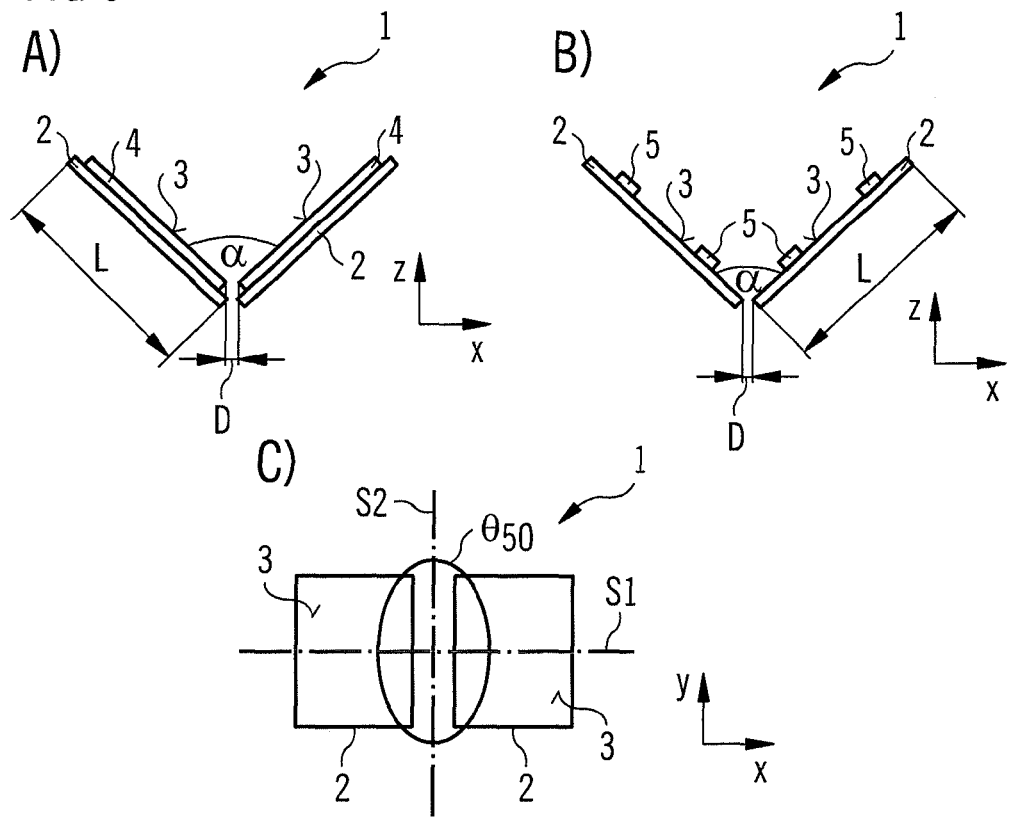

According to FIG. 6A the planar elements 2 each comprise organic light-emitting diodes 4. The organic light-emitting diodes 4 substantially each cover the entire major faces 3 of the associated planar elements 2. The high reflectivity of the planar elements 2 when the semiconductor light source 1 is not in operation stems in particular from a reflectively configured, tabular electrode of the organic light-emitting diodes 4. It is likewise possible for each of the planar elements 2 to be formed by organic light-emitting diodes.

According to FIG. 6B the planar elements each comprise at least four optoelectronic inorganic semiconductor chips 5, which cover only a small fraction of the area of the major face 3. Each of the planar elements 2 may exhibit overall a Lambertian emission profile, even if approximately point light sources are used as the semiconductor chips 5.

The average diameter L of the planar elements 2 amounts for example in each case to between 1 cm and 100 cm, in particular between 3 cm and 30 cm, as is also the case in all the other exemplary embodiments. The major faces 3 are not diffusely reflective, but rather the law of reflection applies in the case of reflection of at least a predominant part of the radiation, such that an angle of emergence of reflected radiation is equal to the angle of incidence thereof.

FIG. 6C is a plan view of the semiconductor light source 1 illustrating the emission pattern with reference to the half-value angle θ50. The emission pattern comprises two axes of symmetry S1, S2, which are oriented orthogonally to one another. Along the axis of symmetry S1, i.e. in the y direction, the half-value angle θ50 is smaller than along the axis of symmetry S2 in the y direction. In the x direction beam focusing thus takes place, whereas in the y direction virtually no beam focusing takes place.

Beam shaping or beam focusing takes places in particular, as also in all the other exemplary embodiments, without the use of lenses or curved reflectors. Beam shaping may thus be achieved solely by reflection at the preferred plane, comparatively large-area major faces 3, i.e. the semiconductor light source 1 may be free of additional, optically diffractively or refractively acting, beam-shaping elements.

Figure 7:
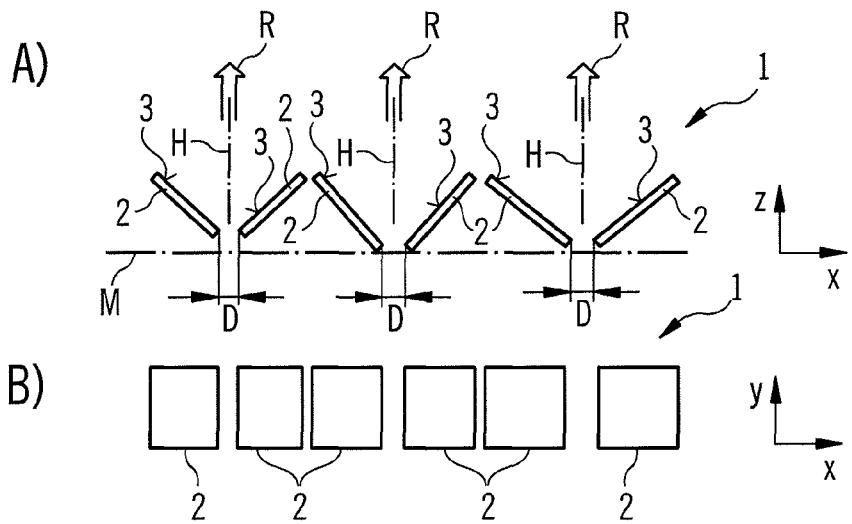

FIG. 7 shows an exemplary embodiment of the semiconductor light source 1 in which the semiconductor light source 1 comprises a plurality of planar elements 2. In each case two of the major faces 3 of the planar elements 2 are arranged facing one another in pairs. In side view, cf. FIG. 7A, the semiconductor light source 1 exhibits a sawtooth-like shape. In other words, the planar elements 2 are arranged in the manner of roofs. All the planar elements 2 terminate in the y direction flush with the mounting surface M.

The radiation R is emitted substantially away from a mounting surface M on which the individual planar elements 2 may be mounted. At the mounting surface M the planar elements 2 exhibit the distance D from one another, whereas at peripheral areas of the planar elements 2 remote from the mounting surface M the planar elements 2 may each touch one another, unlike what is shown in FIG. 7. At variance with the representation in FIG. 7 it is possible, as also in all the other exemplary embodiments, for the distance D to be equal to zero, i.e. for the planar elements 2 thus to be touching in pairs for example.

Figure 8:
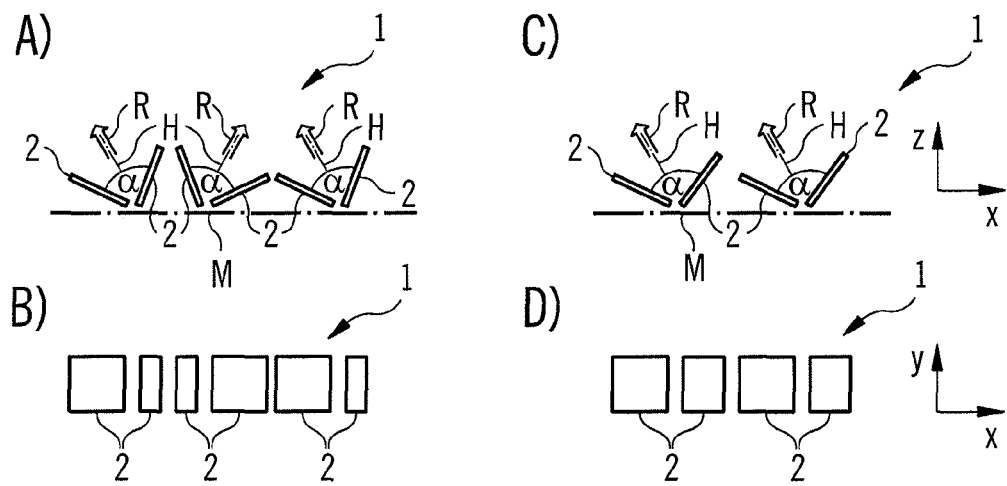

In the exemplary embodiment according to FIG. 8 the planar elements 2, when viewed in plan view or in projection onto the mounting surface M, see FIGS. 8B and 8D, have different areas in pairs. However, the planar elements 2, cf. the side view in FIG. 8A and in FIG. 8C, are of identical size.

The bisectors H of the pairs of planar elements 2 each exhibit an angle different from 90° to the mounting surface M. According to FIG. 8A the bisectors H point in different directions, while according to FIG. 8C all the bisectors H point in the same direction, as also in the exemplary embodiment according to FIG. 7.

FIG. 9 shows a sectional representation of a further exemplary embodiment of the semiconductor light source 1. The pairs of planar elements 2a, 2b are separated from one another spatially by other planar elements 2. The mounting surface M adopts a hemispherical shape. In this exemplary embodiment substantially only the planar elements 2a, 2b are arranged at an angle to one another. The planar elements 2, 2a, 2b are each plane or flat in shape.

In the exemplary embodiment according to FIG. 10 the planar elements 2 are configured as equilateral triangles, which are arranged similar to a tetrahedral pyramid without base surface. The planar elements 2 are each spaced from one another. It is possible for a plurality of the semiconductor light sources 1 according to FIG. 10 to be arranged side by side, so forming a larger, assembled light source.

In the exemplary embodiment according to FIG. 11 the planar elements 2 each comprise a square outline and are arranged in the form of a cube, similar to a retro-reflector, cf. the plan view in FIG. 11A. In FIG. 11B a plurality of semiconductor light sources 1' according to FIG. 11A have been assembled to form a semiconductor light source 1. It is furthermore possible in this case for individual ones of the semiconductor light sources 1' to emit a maximum radiant intensity at mutually different angles, other than is illustrated in FIG. 10.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A semiconductor light source having at least two planar elements, wherein the planar elements each comprise a semiconductor material for producing ultraviolet or visible radiation when the semiconductor light source is in operation, the radiation being emitted in each case exclusively at precisely one major face of the planar elements,
wherein the reflectivity of the planar elements for visible radiation when the semiconductor light source is not in operation is at least 80%,
wherein the average diameter of the planar elements is at least 10 mm,
wherein the major faces are arranged at an angle ($\alpha$) to one another and facing one another,
wherein the angle ($\alpha$) between the major faces is between 30° and 120° inclusive,
wherein a distance between two adjacent planar elements, in a direction perpendicular to a bisector of the angle ($\alpha$), is between 0.15 and 0.35 times inclusive or is between 1.75 and 2.25 times inclusive the average diameter,
wherein a fraction of between 20% and 40% inclusive of the radiation generated in operation is emitted into a half-space remote from the major faces,
wherein beam shaping of radiation emitted by the semiconductor light source is achieved by reflections at the major faces such that the semiconductor light source is free of additional optically diffractively or refractively acting beam-shaping elements, and
wherein the planar elements are arranged in the form of pyramids, hemispheres or cubes.

2. The semiconductor light source according to claim 1, wherein the planar elements comprise organic light-emitting diodes, which each cover at least 50% of the major face of the associated planar element.

3. The semiconductor light source according to claim 1, wherein part of the radiation emitted by the major face of a first one of the planar elements is reflected precisely once at the major face of a second one of the planar elements facing this major face, followed by outcoupling of this part of the radiation out of the semiconductor light source.

4. The semiconductor light source according to claim 1, whose emission pattern exhibits at least one intensity maximum in an angular range of between 25° and 70° inclusive, relative to an emission angle relative to the bisector.

5. The semiconductor light source according to claim 1, wherein an emission pattern, when the semiconductor light source is viewed in plan view, comprises one or two axes of symmetry,
wherein half-value angles of the emission pattern differ from one another along the two axes of symmetry, or along the one axis of symmetry and in a direction perpendicular thereto, and
wherein the half-value angles are those angles at which a radiant intensity has fallen by a half relative to a maximum radiant intensity.

6. The semiconductor light source according to claim 1, wherein the following relationship applies to an emission pattern of the planar elements, with a tolerance of at most 0.1 Imax:

$$I(\beta) = I_{max} \cos(\beta),$$

wherein Imax is a maximum direction-related radiant intensity, $\beta$ an angle to a normal of the associated planar element and I a radiant intensity of the associated planar element in a direction defined by the angle $\beta$.

7. The semiconductor light source according to claim 1, wherein the planar elements each comprise at least four inorganic optoelectronic semiconductor chips, which overall each cover at most 5% of the major face of the associated planar element.

8. The semiconductor light source according to claim 1, wherein the planar elements each reflect visible radiation at least partially such that an angle of incidence of the radiation is equal to an angle of emergence.

9. The semiconductor light source according to claim 1, wherein the planar elements are arranged in the manner of pyramids, hemispheres, cubes and/or like roofs.

10. The semiconductor light source according to claim 1, which comprises a plurality of planar elements, wherein the planar elements are arranged in a sawtooth-like manner, when viewed in cross-section.

11. The semiconductor light source according to claim 1, wherein the planar elements exhibit different areas when the semiconductor light source is viewed in plan view.

12. A semiconductor light source having a plurality of planar elements, wherein
- the planar elements each comprise a semiconductor material for producing ultraviolet or visible radiation when the semiconductor light source is in operation, the radiation being emitted in each case exclusively at precisely one major face of the planar elements,
- the reflectivity of the planar elements for visible radiation when the semiconductor light source is not in operation is at least 80%,
- the average diameter of the planar elements is at least 30 mm,
- the major faces are arranged at an angle to one another and facing one another,
- the angle between the major faces is between 30° and 120° inclusive,
- a distance between two adjacent planar elements, in a direction perpendicular to a bisector of the angle, is between 0.15 and 0.35 times inclusive or is between 1.75 and 2.25 times inclusive the average diameter,
- a fraction of between 20% and 40% inclusive of the radiation generated in operation is emitted into a half-space remote from the major faces,
- the planar elements comprise organic light-emitting diodes, which each cover at least 80% of the major face of the associated planar element,
- in each case two of the major faces of the planar elements are arranged facing one another in pairs so that in a side view the semiconductor light source exhibits a sawtooth-like shape and the planar elements are arranged in the manner of roofs,
- all the planar elements terminate, in a direction perpendicular to a mounting surface, flush with the mounting surface, and
- beam shaping of radiation emitted by the semiconductor light source is achieved by reflections at the major faces such that the semiconductor light source is free of additional optically diffractively or refractively acting beam-shaping elements;
- wherein the planar elements are arranged in the form of pyramids, hemispheres or cubes.

\* \* \* \* \*